(12) United States Patent
Azuma et al.

(10) Patent No.: US 8,492,676 B2
(45) Date of Patent: Jul. 23, 2013

(54) LASER DICING DEVICE

(75) Inventors: Masayuki Azuma, Mitaka (JP);
Yasuyuki Sakaya, Mitaka (JP)

(73) Assignee: Tokyo Seimitsu Co., Ltd., Hachioji-shi, Tokyo (JP)

( * ) Notice: Subject to any disclaimer, the term of this patent is extended or adjusted under 35 U.S.C. 154(b) by 2318 days.

(21) Appl. No.: 10/555,451

(22) PCT Filed: May 17, 2004

(86) PCT No.: PCT/JP2004/006993
§ 371 (c)(1),
(2), (4) Date: Nov. 3, 2005

(87) PCT Pub. No.: WO2004/105110
PCT Pub. Date: Dec. 2, 2004

(65) Prior Publication Data
US 2006/0124615 A1    Jun. 15, 2006

(30) Foreign Application Priority Data

May 22, 2003   (JP) .................................. 2003-144598

(51) Int. Cl.
*B23K 26/14* (2006.01)
(52) U.S. Cl.
USPC ............ 219/121.67; 219/121.72; 219/121.78; 219/121.82
(58) Field of Classification Search
USPC ............. 219/121.67, 121.72, 121.78, 121.82
See application file for complete search history.

(56) References Cited

U.S. PATENT DOCUMENTS 4,789,770 A * 12/1988 Kasner et al. ............... 219/121.7
6,407,360 B1 * 6/2002 Choo et al. ............... 219/121.67

(Continued)

FOREIGN PATENT DOCUMENTS

| JP | 2002-192367 A | 7/2002 |
| JP | 2002-192368 A | 7/2002 |
| JP | 2002-192369 A | 7/2002 |
| JP | 2002-192370 A | 7/2002 |

(Continued)

OTHER PUBLICATIONS

English Translation of PCT International Preliminary Report on Patentability, Form PCT/ IPEA/409, 3 pages.

*Primary Examiner* — M. Alexandra Elve
(74) *Attorney, Agent, or Firm* — Roberts Mlotkowski Safran & Cole, P.C.; David S. Safran

(57) ABSTRACT

There is provided a laser dicing apparatus comprising: a first position detecting device detecting a position of the surface of a wafer at an incident point of laser light; second position detecting device detecting in advance a position of the surface of the wafer; and a control section controlling the position in the thickness direction of a condensing point inside the wafer, wherein the control section, when scanning the laser light from the outside of a periphery of the wafer to the inside of the periphery of the wafer, performs control based on data obtained with the second position detecting device detecting the position of the condensing point at the periphery of the wafer, and after scanning a predetermined distance, switches to perform control based on data obtained by the first position detecting device. Thereby, when the laser light is made incident through the surface of the wafer and scanned, the position control of the condensing point of the laser light can be performed even at the periphery of the wafer, and a modified region by multi-photon absorption can be formed at a predetermined position inside the wafer.

4 Claims, 5 Drawing Sheets

U.S. PATENT DOCUMENTS

| | | |
|---|---|---|
| 6,992,026 B2 | 1/2006 | Fukuyo et al. |
| 2002/0005958 A1* | 1/2002 | Sekiya .......................... 356/631 |
| 2002/0190435 A1* | 12/2002 | O'Brien et al. ............... 264/400 |
| 2004/0002199 A1* | 1/2004 | Fukuyo et al. ................ 438/460 |
| 2006/0144828 A1 | 7/2006 | Fukumitsu et al. |

FOREIGN PATENT DOCUMENTS

| | | |
|---|---|---|
| JP | 2002-192371 A | 7/2002 |
| JP | 2002-205180 A | 7/2002 |

* cited by examiner

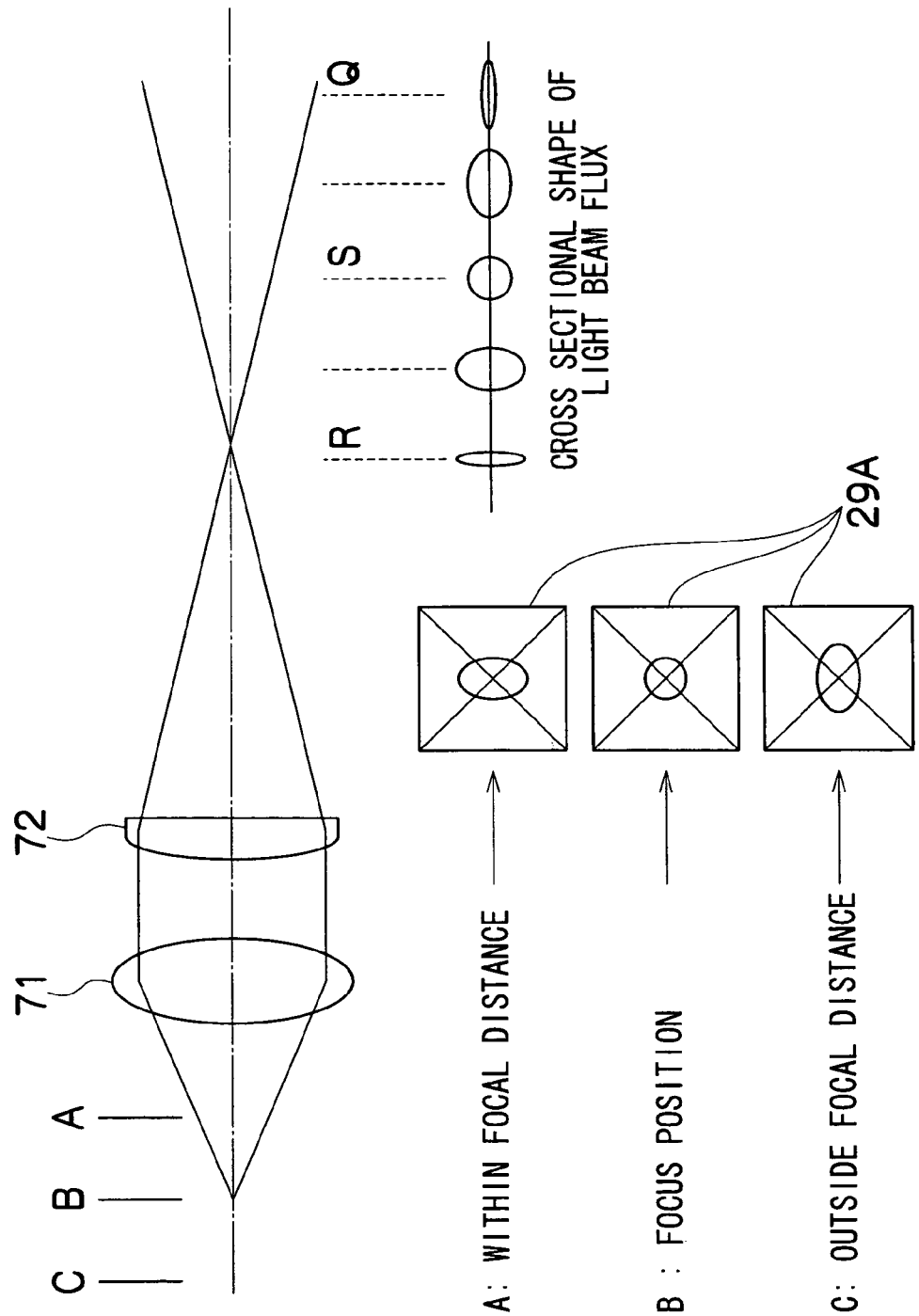

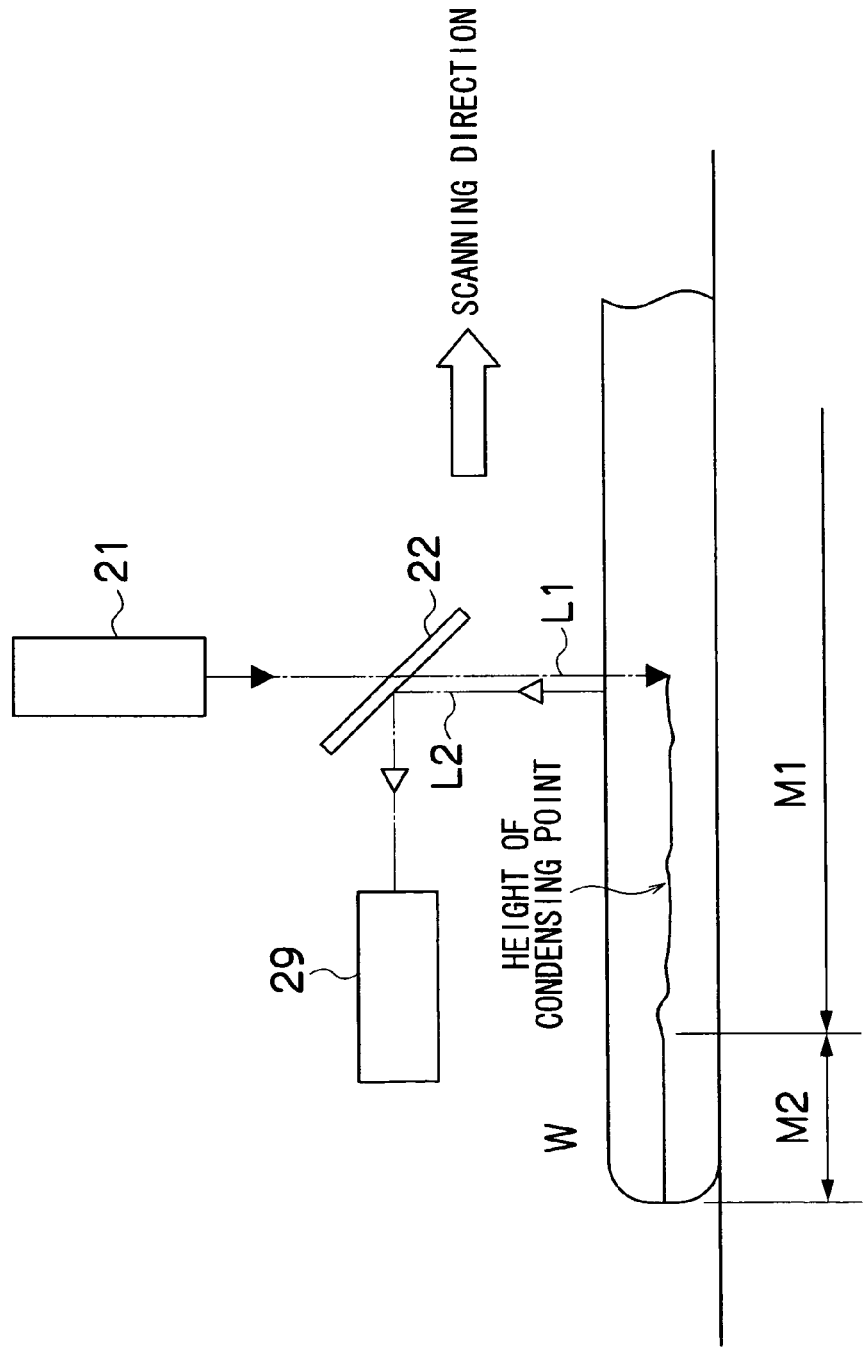

LASER DICING DEVICE

TECHNICAL FIELD

The present invention relates to a dicing apparatus dividing a wafer of semiconductor devices, electronic components or the like into individual chips, and more particularly to a dicing apparatus in which laser light is applied.

BACKGROUND ART

Conventionally, in order to divide a wafer, on the surface of which semiconductor devices, electronic components and the like are formed, into separate chips, there has been used a dicing apparatus which forms grinding grooves in the wafer by a thin grindstone referred to as a dicing blade and cuts the wafer. The dicing blade is formed by making fine diamond abrasive grains electrodeposited by use of nickel, and the dicing blade having an extremely thin thickness of about 30 μm is used.

In the dicing apparatus, the dicing blade is rotated at a high speed of 30,000 to 60,000 rpm to form a cut in the wafer, so that the wafer is completely cut (full cutting) or incompletely cut (half cutting or semi-cutting). The half cutting is a processing method for cutting the wafer to a depth of about half the thickness of the wafer, and the semi-full cutting is a method for forming grinding grooves in the wafer by leaving about 10 μm of the thickness of the wafer.

However, when the grinding work is performed by the dicing blade, since the wafer is a highly brittle material, the work has to be a brittle mode and chipping is generated on the front surface and the rear surface of the wafer. This chipping causes the performance of divided chips to be degraded. In particular, the chipping generated on the rear surface makes a crack proceed into the inside of the chips, which is a troublesome problem.

Instead of cutting by use of the conventional dicing blade, as a method to solve the chipping problem in the dicing process, there is proposed a technique relating to a laser processing method in which laser light with a condensing point arranged inside the wafer is made incident so as to form a modified region by multi-photon absorption inside the wafer, and in which the wafer is divided into individual chips by using the modified region as a reference point (see for example, Japanese Patent Application Laid-Open No. 2002-192367, Japanese Patent Application Laid-Open No. 2002-192368, Japanese Patent Application Laid-Open No. 2002-192369, Japanese Patent Application Laid-Open No. 2002-192370, Japanese Patent Application Laid-Open No. 2002-192371, and Japanese Patent Application Laid-Open No. 2002-205180).

In this laser processing method, a modified region formed inside the wafer is formed at a constant depth from the surface of the wafer, so that it is necessary to detect the height of the surface of the wafer to control the position of the condensing point of the laser light.

For this reason, conventionally as shown in FIG. 5, laser light L1 emitted from a laser oscillator is made incident through the surface of the wafer W, and the condensing point is adjusted to the inside of the wafer, so as to make a modified region P formed inside the wafer, while laser light L2 partially reflected from the surface of the wafer is taken into an optical measuring device 129 through a half mirror 126 so that the position of the surface of the wafer is detected.

However, in the case of the method for detecting the surface of the wafer as shown in FIG. 5, the surface detection point and the processing point by the laser are the same. Thus, when the position of the condensing point of the laser light L1 for processing is controlled on the basis of detected position data in the thickness direction of the wafer surface, a delay is caused in the control because of the high processing rate.

As a result, there is a problem that when the laser light is scanned from the outside of the edge of the wafer toward the inside of the wafer, the condensing point of the laser light cannot be adjusted to the inside of the wafer in the vicinity of the edge of the wafer and thereby the modified region cannot be formed.

The present invention has been made in view of the above described circumstances. An object of the present invention is to provide a laser dicing apparatus in which when laser light is incident from the surface of the wafer and scanned, the position control of the condensing point of the laser light can be performed even at the periphery of the wafer, and in which a modified region by multi-photon absorption can be formed at a predetermined position inside the wafer.

DISCLOSURE OF THE INVENTION

In order to achieve the above described object, according to the present invention, there is provided a laser dicing apparatus which scans laser light while making the laser light of which condensing point is adjusted to the inside of a wafer incident from the surface of the wafer, and which makes a modified region formed inside the wafer for dicing and dividing the wafer into individual chips, the laser dicing apparatus comprising: a first position detecting device detecting a position in the thickness direction of the wafer surface at an incident point of the laser light; a second position detecting device provided separately from the first position detecting device and detecting in advance a position in the thickness direction of the wafer surface; and a control section controlling the position of the condensing point in the thickness direction inside the wafer, wherein when the laser light is scanned from the outside of the periphery of the wafer to the inside of the periphery of the wafer, the control section performs control of the position in the thickness direction of the condensing point at the periphery of the wafer on the basis of the position data in the thickness direction obtained in advance by the second position detecting device, and wherein after scanning the laser light for a predetermined distance, the control section switches to perform the control on the basis of the position data in the thickness direction of the wafer surface obtained by the first position detecting device.

In the laser dicing apparatus according to the present invention, the position in the thickness direction of the wafer surface at the periphery of the wafer can be obtained in advance by the second position detecting device, and the position of the condensing point of the laser light can be controlled on the basis of the position data in the thickness direction of the wafer surface obtained by the second position detecting device, so that even at the periphery of the wafer, a modified region by multi-photon absorption can be formed at a predetermined position inside the wafer.

In the laser dicing apparatus according to the present invention, an aligning device aligning the wafer may also be provided so that the position in the thickness direction of the wafer surface at the periphery of the wafer is detected by the second position detecting device when the wafer is aligned.

According to this embodiment, the position in the thickness direction of the wafer surface at the periphery of the wafer is detected by using the second position detecting device when the wafer is aligned, so that the time for detecting the position can be made to overlap the time for aligning the wafer, and thereby the time required for dicing the wafer can be reduced.

Further, in the laser dicing apparatus according to the present invention, the first position detecting device may be arranged to detect the position in the thickness direction of the wafer surface at the incident point of the laser light in real time with respect to the scanning operation of the laser light.

According to this embodiment, the first position detecting device can detect the position in the thickness direction of the wafer surface at the incident point of the laser light in real time with respect to the scanning operation of the laser light, so that the position of the condensing point of the laser light can be controlled with a slight delay, and thereby highly precise control can be performed.

BRIEF DESCRIPTION OF THE DRAWINGS

FIG. 3 is a conceptual diagram explaining a measurement principle of an astigmatic optical measuring device;

FIG. 4 is a conceptual diagram explaining a position in the thickness direction of a condensing point.

BEST MODE FOR CARRYING OUT THE INVENTION

Figure 1:
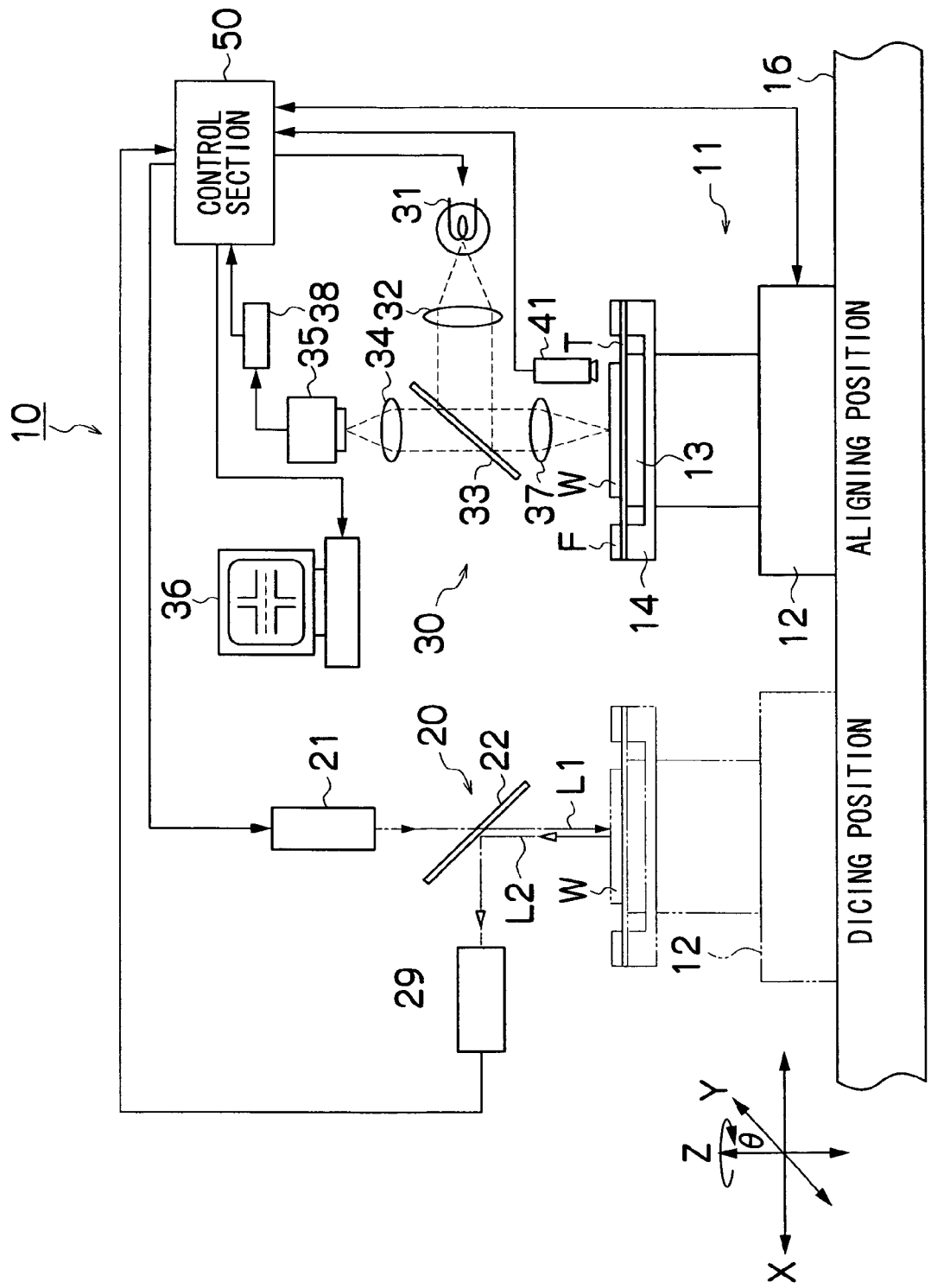
FIG. 1 is a schematic representation of a laser dicing apparatus of an embodiment according to the present invention.

In the following, preferred embodiments of a laser dicing apparatus according to the present invention will be described in detail with reference to accompanying drawings. Noted that in each figure, the same member is denoted by the same reference numeral or the same reference character.

FIG. 1 is a schematic representation of a laser dicing apparatus according to the present invention. The laser dicing apparatus 10 comprises a wafer moving section 11, a laser optical section 20, an aligning device 30, a surface detecting device 41, a control section 50 and the like, as shown in FIG. 1.

The control section 50 includes a CPU, a memory, an input/output circuit section and the like, and controls an operation of each part of the laser dicing apparatus 10.

The wafer moving section 11 includes a XYZ θ table 12 provided for a main body base 16 of the laser dicing apparatus 10, and a suction stage 13 sucking and holding a wafer W mounted to a frame F via a dicing tape T, placed on the XYZ θ table 12, and the like. The wafer W is precisely moved in the XYZ θ direction shown in FIG. 1 by the wafer moving section 11.

The laser optical section 20 comprises a laser oscillator 21, a half mirror 22, an astigmatic optical measuring device 29 as a first position detecting device detecting a position in the thickness direction of the wafer surface and the like.

Further the aligning device 30 comprises an observation light source 31, a collimator lens 32, a half mirror 33, condensing lenses 34, 37, a CCD camera 35 as an imaging device, an image processing section 38, a television monitor 36 and the like.

The surface detecting device 41 as second position detecting device detecting a position in the thickness direction of the wafer surface, for which an electrostatic capacitance type detector is used, detects the position in the thickness direction of the wafer surface in non-contacting manner. Noted that known non-contacting detectors such as various optical detectors and an air micrometer can be used as the surface detecting device 41 other than the electrostatic capacitance type detector.

In the aligning device 30, illumination light emitted from the observation light source 31 is irradiated to the surface of the wafer W through the optical system including the collimator lens 32, the half mirror 33, the condensing lens 37 and the like. Reflected light from the surface of the wafer W is incident on the CCD camera 35 as an imaging device through the condensing lens 37, the half mirror 33, and the condensing lens 34, so that a surface image of the wafer W is picked up.

The picked up image data is image-recognized in the image processing section 38 and sent to the control section 50, so that the XYZ θ table 12 is driven in the direction of X, Y, Z and θ so as to align the wafer W. At the time of this aligning operation, a position in the thickness direction of the surface of the periphery of the wafer W is measured by the surface detecting device 41, and is stored in the memory of the control section 50. Further, the picked up image is displayed in the television monitor 36 through the control section 50. In the laser optical section 20, laser light L1 for processing emitted from the laser oscillator 21, whose condensing point is adjusted to the inside of the wafer W, forms a modified region by multi-photon absorption in the vicinity of the condensing point. Here, the laser light having transmissivity to the dicing tape in a condition of the peak power density at the condensing point not smaller than $1 \times 10^8$ (W/cm$^2$), and the pulse width up to 1 µs. The position in the Z direction of the condensing point is adjusted by a fine movement in the Z direction of the collimator lens (not shown).

Figure 2A:
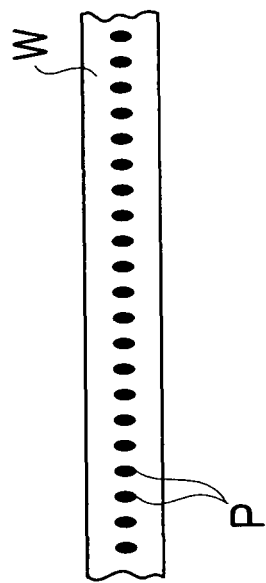
FIG. 2(a) and FIG. 2(b) are conceptual diagrams explaining a modified region formed inside a wafer.
Figure 2B:
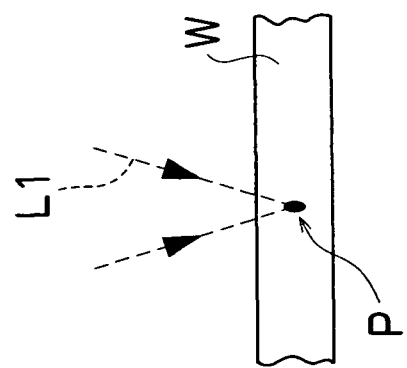
Figure 5:
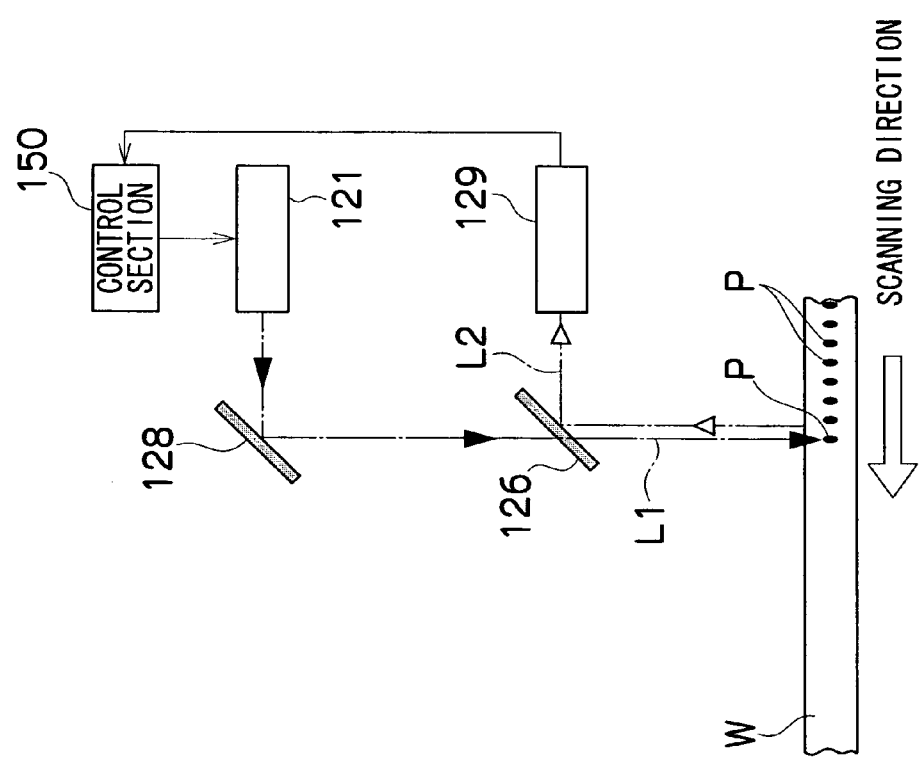
FIG. 5 is a conceptual diagram explaining a conventional laser optical section.

FIG. 2 is a conceptual diagram explaining a modified region formed in the vicinity of the condensing point inside the wafer. FIG. 2(a) shows a state where a modified region P is formed at the condensing point by the laser light L1 for processing made incident to the inside of the wafer. FIG. 2(b) schematically shows a state where a plurality of discontinuous modified regions P are formed side by side in the inside of the wafer W by scanning the pulse-like laser light L1 for processing in parallel to the surface of the wafer W. In this state, the wafer W is divided from the modified region P as a starting point naturally, or divided along the modified region P by applying a slight external force. In this case, the wafer W is easily divided into chips, without the chipping being generated on the front surface and the rear surface of the wafer W.

As shown in FIG. 1, part of the laser light irradiated to the surface of the wafer W is reflected by the surface of the wafer W, and is horizontally directed by the half mirror 22. The reflected light is then incident on the astigmatic optical measuring device 29 as the laser light L2 for surface detection, so as to be received by a quadripartite photodiode 29A (as will be described below).

A signal from the quadripartite photodiode 29A is processed by the control section 50, so that the position in the thickness direction of the surface of the wafer W is obtained. On the basis of the position data in the thickness direction of the surface of the wafer W, the position of the condensing point of the laser light L1 is finely adjusted.

FIG. 3 is a conceptual diagram explaining a measurement principle of an astigmatic optical measuring device. The position of a light spot on the surface of the wafer on which an image is formed by an objective lens 71 is set to Q. In order to impart astigmatism, a cylindrical lens 72 is placed behind the objective lens 71. When the image forming position by the cylindrical lens 72 is set to R, the cross sectional shape of the light beam flux at a point between R and Q changes from an ellipse with vertical major axis to an ellipse with horizontal major axis, as the point is moved from R to Q. At the point S between R and Q, the cross sectional shape of the light beam flux is circular.

The cross sectional shape of the light beam flux at the point S varies, as shown in FIG. 3, depending on the position of the surface of the wafer (for example, A: within the focal distance of the objective lens 71, B: at the focus position, C: outside the focal distance), so that an output signal corresponding to the position of the surface of the wafer can be obtained by performing photoelectrical conversion of the light beam flux by use of the quadripartite photodiode 29A and by performing arithmetic operation on the converted signal. As described above, the position of the wafer surface is detected in principle by using astigmatism.

Next, the dicing processing of the wafer W is explained. When the wafer W is diced, as shown in FIG. 1, the wafer W is mounted to a ring-shaped dicing frame F via a dicing tape T having an adhesive material on one of its surfaces, and is conveyed in this state during the dicing processing. The dicing tape is stuck to the rear surface of the wafer W in this way, so that when the wafer W is divided into individual chips, the chips are prevented from being separated from each other.

The wafer W is sucked and held by the suction stage 13 in this state. The circuit pattern formed on the surface of the wafer W is first imaged by the CCD camera 35, and then the wafer W is aligned in the θ direction and positioned in the XY direction by an aligning device having the image processing section 38. In the aligning operation, position data in the thickness direction of the surface at the periphery of the wafer W are obtained by the surface detecting device 41, and stored in the memory of the control section 50.

When the aligning processing is completed, the XYZ θ table 12 is moved in the XY direction, so that the laser light L1 for processing is made incident from the laser oscillator 21 along the dicing street of the wafer W. At the same time, the laser light L2 for surface detection, which is reflected by the wafer surface, is changed in its direction by the half mirror 22 so as to be incident on the astigmatic optical measuring device 29. Thereby, the position in the thickness direction of the wafer surface is detected by the astigmatic optical measuring device 29.

In the control section 50, the position data in the thickness direction at the periphery of the wafer W have not yet been obtained by the astigmatic optical measuring device 29 when the laser light is scanned from the outside of the wafer W to the inside of wafer W. For this reason, when the aligning operation is performed, the data obtained in advance by the surface detecting device 41 are called from the memory, and the position in the thickness direction of the condensing point of the laser light L1 for processing is set on the basis of these data.

The energy of the laser light L1 is condensed in this position, so that a modified region P by multi-photon absorption is formed in wafer W in this position. Subsequently, after the scanning operation is performed for a predetermined period of time, the position control of the condensing point is switched so as to be based on the position data in the thickness direction of the wafer surface obtained by the astigmatic optical measuring device 29.

FIG. 4 is a conceptual diagram explaining the state in which the position control is switched. As shown in FIG. 4, when the laser scanning is performed in the direction from the left side to the right side in FIG. 4, the position of the condensing point of the laser light L1 for processing from the periphery of the wafer W up to the distance M2, is set on the basis of the data obtained in advance by the surface detecting device 41 during the aligning operation, and the modified region P is formed at the height corresponding to these data. Then, the position data in the thickness direction of the wafer surface serving as the basis for position control of the condensing point are switched to the data obtained by the astigmatic optical measuring device 29, on the basis of which data the position of the condensing point within the section M2 is subsequently controlled.

In this way, the condensing point of the laser light L1 for processing, which is made incident through the surface of the wafer W, is controlled inside the wafer W in the thickness direction. Thus, the energy of the laser light L1 for processing which is transmitted through the surface of the wafer, is condensed at the predetermined condensing point inside the wafer, and thereby the modified region P by multi-photon absorption, such as a crack region, a melting region, and a refractive index changing region, is formed in the vicinity of the condensing point inside the wafer W. As a result, the balance of intermolecular forces is broken, so that the wafer W can be divided naturally or by applying slight external force.

When the modified region is formed for all dicing streets in one direction of the wafer W, the XYZ θ table 12 is rotated by 90°, and the modified region forming processing is also performed for all dicing streets in the direction perpendicular to the dicing streets for which the modified regions have been formed.

Noted that in the above described embodiment, the laser scanning operation is performed by moving the XYZ θ table 12, but the operation may also be performed by moving the laser optical section 20.

Further, the laser dicing is performed by making the laser light L1 for processing incident through the top surface of the wafer W in the above described embodiment, but the present invention is not limited to the case, and the laser light L1 for processing may also be made incident from the rear surface side of the wafer W. In this case, the laser light L1 for processing passes through the dicing tape T so as to be incident on the wafer W, or the wafer W whose top surface is downwardly arranged is stuck to the dicing tape T. Further, in this case, it is necessary to use the light such as infrared light, capable of passing through the wafer W from the rear surface side, and to perform the aligning operation by observing the circuit pattern on the wafer surface.

INDUSTRIAL APPLICABILITY

As described above, in the laser dicing apparatus according to the present invention, it is possible to obtain in advance the position in the thickness direction of the wafer surface at the periphery of the wafer, and to control the position of the condensing point of the laser light at the periphery of the wafer on the basis of the position data in the thickness direction of the wafer surface obtained by the second position detecting device, as a result of which the modified region by multi-photon absorption can be formed in the predetermined position inside the wafer even at the periphery of the wafer.

Further, the position in the thickness direction of the wafer surface at the periphery of the wafer is detected in advance by using the second position detecting device when the aligning operation of the wafer is performed, and thereby the time for detecting the position can be made to overlap the time for the aligning operation, as a result of which the time required for dicing the wafer can be reduced.

The invention claimed is:
1. A laser dicing apparatus making laser light, of which condensing point is arranged to the inside of a wafer, incident through the surface of said wafer while scanning the laser light, and dicing said wafer by forming a modified region inside said wafer to divide said wafer into individual chips, said laser dicing apparatus comprising:

a first position detecting device detecting a position in the thickness direction of the surface of said wafer at the incident point of said laser light;

a second position detecting device provided separately from the first position detecting device, and detecting in advance a position in the thickness direction of the surface of said wafer;

a memory in which position data of the coordinates of the position in the thickness direction of the surface of said wafer obtained by said second position detecting device is stored, and a control section controlling the position in the thickness direction of said condensing position inside said wafer, wherein the control section, when scanning said laser light from the outside of a periphery of the wafer to the inside of the periphery of the wafer, performs control based on position data in the thickness direction of the surface of the wafer obtained with said second position detecting device recalled from said memory, and after scanning a predetermined distance, switches to perform control based on position data in the thickness direction of the surface of the wafer obtained by said first position detecting device.

2. The laser dicing apparatus according to claim 1, further comprising an aligning device aligning said wafer, wherein when said wafer is aligned, the position in the thickness direction of the surface of the wafer at the periphery of the wafer is detected by said second position detecting device.

3. The laser dicing apparatus according to claim 1, wherein said first position detecting device the position in the thickness direction of the surface of said wafer at the incident point of said laser light in real time with respect to the scanning operation of said laser light.

4. The laser dicing apparatus according to claim 2, wherein said first position detecting device detects the position in the thickness direction of the surface of said wafer at the incident point of said laser light in real time with respect to the scanning operation of said laser light.

* * * * *